United States Patent [19]

Hsu et al.

[11] Patent Number: 5,432,748
[45] Date of Patent: Jul. 11, 1995

[54] SOLID STATE PERIPHERAL STORAGE DEVICE

[75] Inventors: Juei-Chi Hsu; Ching S. Jeng, both of San Jose; Ping Wang, Saratoga, all of Calif.

[73] Assignee: Silicon Storager Technology, Inc., Sunnyvale, Calif.

[21] Appl. No.: 237,682

[22] Filed: May 4, 1994

Related U.S. Application Data

[62] Division of Ser. No. 977,697, Nov. 13, 1994, Pat. No. 5,359,570.

[51] Int. Cl.$^6$ .................... G06F 12/00; G11C 13/00
[52] U.S. Cl. ............... 365/230.01; 365/185; 365/200
[58] Field of Search ............ 365/182, 189.01, 200, 365/230.01, 900, 185

[56] References Cited

U.S. PATENT DOCUMENTS

| | | | |
|---|---|---|---|
| 4,398,248 | 8/1983 | Hsia et al. | 364/200 |
| 4,780,855 | 10/1988 | Iida et al. | |
| 4,984,149 | 1/1991 | Iwashita et al. | |
| 4,984,151 | 1/1991 | Dujari | |
| 5,200,959 | 4/1993 | Gross et al. | |
| 5,291,584 | 3/1994 | Challa et al. | 395/500 |
| 5,329,488 | 7/1994 | Hashimoto | 365/200 |
| 5,337,275 | 8/1994 | Garner | 365/189.01 |
| 5,341,339 | 8/1994 | Wells | 365/189.01 |
| 5,349,558 | 9/1994 | Cleveland et al. | 365/200 |

FOREIGN PATENT DOCUMENTS 0392895  10/1990  European Pat. Off. .

*Primary Examiner*—Viet Q. Nguyen
*Attorney, Agent, or Firm*—Limbach & Limbach; Ronald L. Yin

[57] ABSTRACT

A solid state peripheral storage device receives an LSN address from a computer system and provides a mapping to a PSN data. The PSN data addresses memory units which are made out of solid state floating gate storage cells. In addition, a microsequencer controls the operation of the translation of the mapping of the LSN to PSN. Through the use of the mapping of LSN to PSN, defective sectors in the memory units can be mapped out and fresh, unused, defective-free sectors can then be replaced, all automatically, without user intervention. Finally, the microsequencer has error recovery routines to further enhance the reliability of the peripheral device.

10 Claims, 3 Drawing Sheets

SOLID STATE PERIPHERAL STORAGE DEVICE

This is a divisional of application Ser. No. 07/977,697, filed Nov. 13, 1994, U.S. Pat. No. 5,359,570.

This application is submitted with a microfiche appendix having Exhibits A and B and containing copyrighted material, Copyright 1992, Silicon Storage Technology, Inc. The appendix consists of Exhibit A: one (1) microfiche with eighty-five (85) frames and Exhibit B: one (1) microfiche with ten (10) frames.

The copyright owner has no objection to the facsimile reproduction by anyone of the patent document or the patent disclosure, as it appears in the Patent and Trademark Office patent file or records, but otherwise reserves all copyright rights whatsoever in the appendix.

TECHNICAL FIELD

The present invention relates to a peripheral storage device employing floating gate solid state cells as the storage medium. More particularly, the present invention relates to such a device and a method of operating the device.

BACKGROUND OF THE INVENTION

Peripheral devices to a computer are well known in the art. One prior art peripheral device employs magnetic medium as the storage medium. This is evidenced by hard disk drives and floppy disk drives. Hard disk drives can be erased and programmed many times. In addition, they can store a large capacity. Another type of peripheral storage device using solid state memory is the Read Only Memory (ROM). ROM's can be programmable once or read only. Solid state memory devices have the advantage that they consume less power and have faster access time. However, unlike magnetic medium, they cannot be erased and programmed repeatedly.

More recently, as scale of integration has increased, floating gate solid state memory devices have been suggested as being useable in a peripheral storage device. Floating gate memory devices have the advantage that they can be programmed and erased, electrically, thereby, exhibiting the advantages of ROM memory, i.e., low power consumption and faster access, along with the writeability of magnetic medium. In addition, as integrated circuit fabrication scale increases, greater density can be achieved. However, one problem of using the floating gate solid state memory device is that the chip must be virtually defect free. Since the price of each memory chip is dependent upon its yield (the inverse of defect), more stringent requirement of defect free means low yield and high price per chip.

In anticipation of solid state memory storage devices proliferating, a standard, PCMCIA, has been adopted to set the electrical and mechanical interface requirements between a solid state storage peripheral device and a computer system.

SUMMARY OF THE INVENTION

A solid state storage device which interfaces with a computer and receives a first address signal therefrom has a memory containing a conversion table to translate the first address signal into a second address signal. The device also has a solid state memory which comprises a plurality of floating gate storage cells. The device has means for addressing the plurality of floating gate storage cells by the second address signal to supply data signals thereto from the computer or to retrieve data signals therefrom for the computer. Finally, the device has means to change the conversion table from a first address signal to a third address signal in the event the floating gate storage cells in the memory at the second address signal are defective.

DETAILED DESCRIPTION OF THE DRAWINGS

Figure 1:
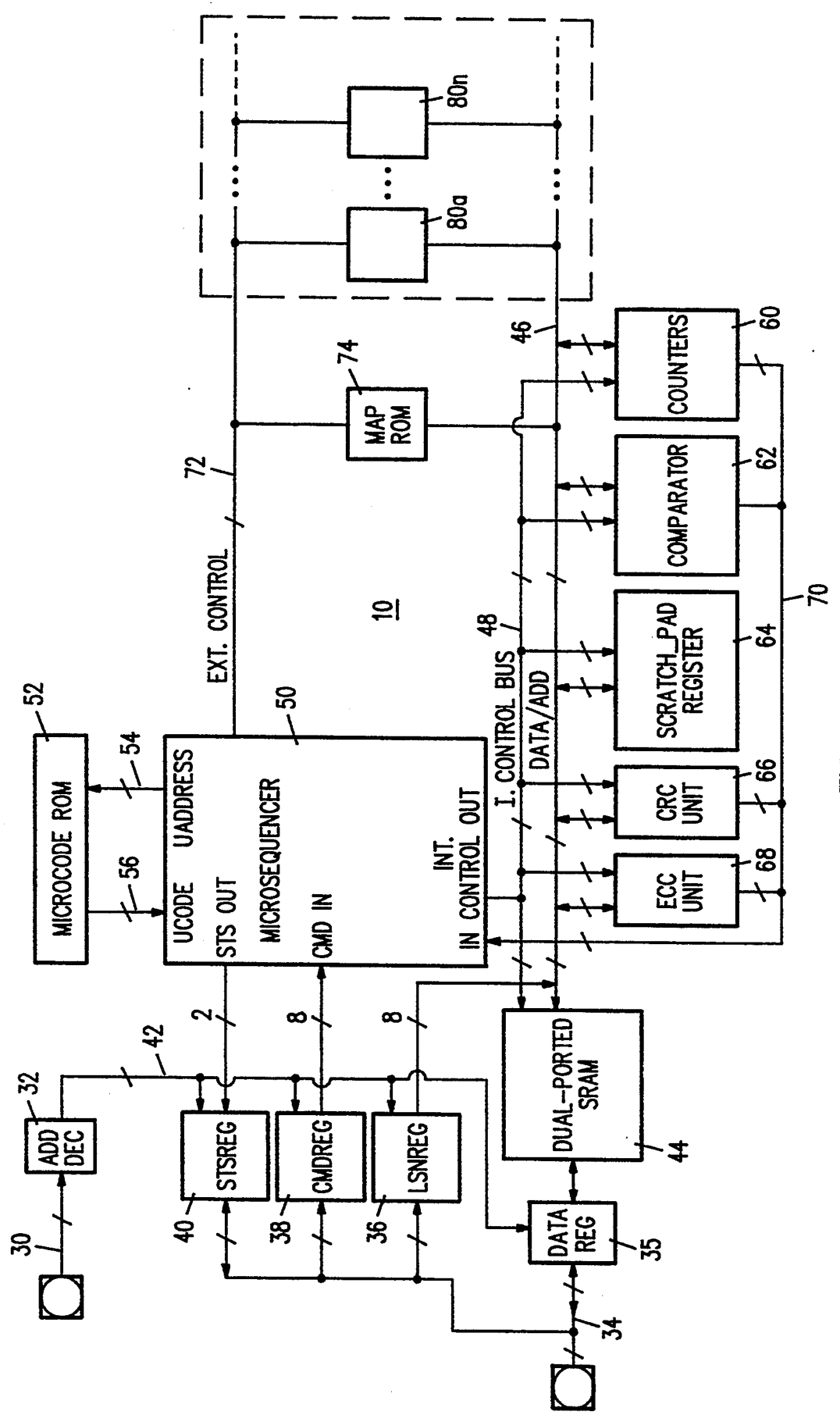
FIG. 1 is a block level schematic diagram of the solid state memory storage device of the present invention.

Referring to FIG. 1 there shown a schematic block level diagram of a solid state memory storage device 10 of the present invention. The device 10 is a peripheral device for use with a computer system, shown in FIG. 2. Typically, a computer system 12, has a CPU 14 which addresses a memory 16 to store or to retrieve data therefrom. In addition, the system 12 comprises a peripheral device 18 such as a HDD (hard disk drive), a display 20, and an I/O unit 22, such as a keyboard. As is well known in the art, where the system 12 is a IBM PC compatible system operating under PC DOS or MS DOS operating system, a software called a device driver 24 must be loaded into the memory 16 to enable the CPU 14 to address the device 10, of the present invention. A copy of a device driver 24, suitable for use with an IBM PC compatible computer 12 operating PC DOS or MS DOS or other similar operating system is set forth in Exhibit A. The driver 24 can be loaded into the memory 16 from the HDD 18 or, as will be seen, even from the device 10 itself.

Referring to FIG. 1, the device 10 receives data signals along a data bus 34 from the system 12. The data bus 34 is supplied to a data register 35, a Logical Sector Number (LSN) register 36, a command (CMD) register 38, and a status (STS) register 40. In the preferred embodiment, since the device 10 interfaces with an IBM PC compatible computer 12, the data bus 34 is 16 bits wide. The data register 35 is 16 bits wide. The LSN register 36, and the CMD register 38 are all 8 bits wide. The STS register 40 is 1 bit.

The device 10 also receives address signals along an address bus 30 from the system 12. The address signal 30 are supplied to an address decoder 32. From the address decoder 32, command signals 42 are supplied to the STS register 40, CMD register 38, LSN register 36 and data register 35 to gate or clock-in the data signals into one of those registers. In the preferred embodiment the address bus 30 is 3 bits wide.

The data register 35 is a dual port register 35 which stores the data signals supplied from the system 12 to be stored in the device 10. In addition the data register 35 also serves to buffer the data signals from the device 10 to be supplied to the system 12. The LSN register 36 contains the logical sector number to which the data in the data register 35 is to be stored in the device 10 or is the location from which data from the device 10 is to be retrieved. The CMD register 38 contains the command of either read or write, i.e., to retrieve data from the device 10 or to store data into the device 10. Finally, the STS register comprised of 2 bits, is a status register containing the response status code after the device 10 had executed the command contained in the CMD register 38. The status register contains a READY bit and an ERROR bit. READY bit indicates that the device 10 has completed the command in the CMD register 38 and is ready for the next command. ERROR bit indicates that an error has occurred for the command just attempted to be executed.

The data from the data register 35 is supplied to a dual port SRAM 44. The SRAM 44 has two ports: one port in communication with the data register 35 and another port which is accessible by a multiplexed data-/address bus 46. The bus 46 is a bus which supplies multiplexed data signals and address signals thereon. Finally, the dual port SRAM 44 is also accessed by an internal control bus 48 which is supplied from a microsequencer 50 (to be discussed hereinafter).

The microsequencer 50 sets the bits in the STS register 40. In addition, the microsequencer 50 receives the contents of the register 38. The LSN register 36 is connected directly to the data/address bus 46. The microsequencer 50 is in communication with a ROM 52 which contains microcode, a copy which is set forth in Exhibit B. The microsequencer 50 issues microaddress along a microaddress bus 54 to the ROM 52 and receives microcode instructions from the microcode ROM 52 along a microcode bus 56. The microsequencer 50, as previously discussed, issues commands along an internal control bus 48 which is supplied to a plurality of units: counters 60, comparator 62, scratch pad register 64, CRC unit 66, and ECC unit 68. Each of the above-mentioned units 60-68 is connected to the data/address bus 46 and receives data therefrom. The counter 60, comparator 62, CRC unit 66, and the ECC unit 68 operates on the data signals from the data-/address bus 46 and provides an output thereof supplied on the test bus 70. The test bus 70 is supplied back to the microsequencer 50. Finally, the microsequencer 50 supplies control signals along an external control bus 72.

The device 10 also comprises a MAP ROM 74. To which the external control bus 72 and the data/address bus 46 are connected. Finally, the external control bus 72 and the data/address bus 46 are supplied to a plurality of solid state memory storage units 80 (A-N). Each of the memory units 80 comprises a plurality of floating gate storage cells of the type, such as disclosed in U.S. Pat. No. 5,029,130, and assigned to the present assignee. In the preferred embodiment, the MAP ROM 74 is also the same as the memory units 80.

Figure 3:
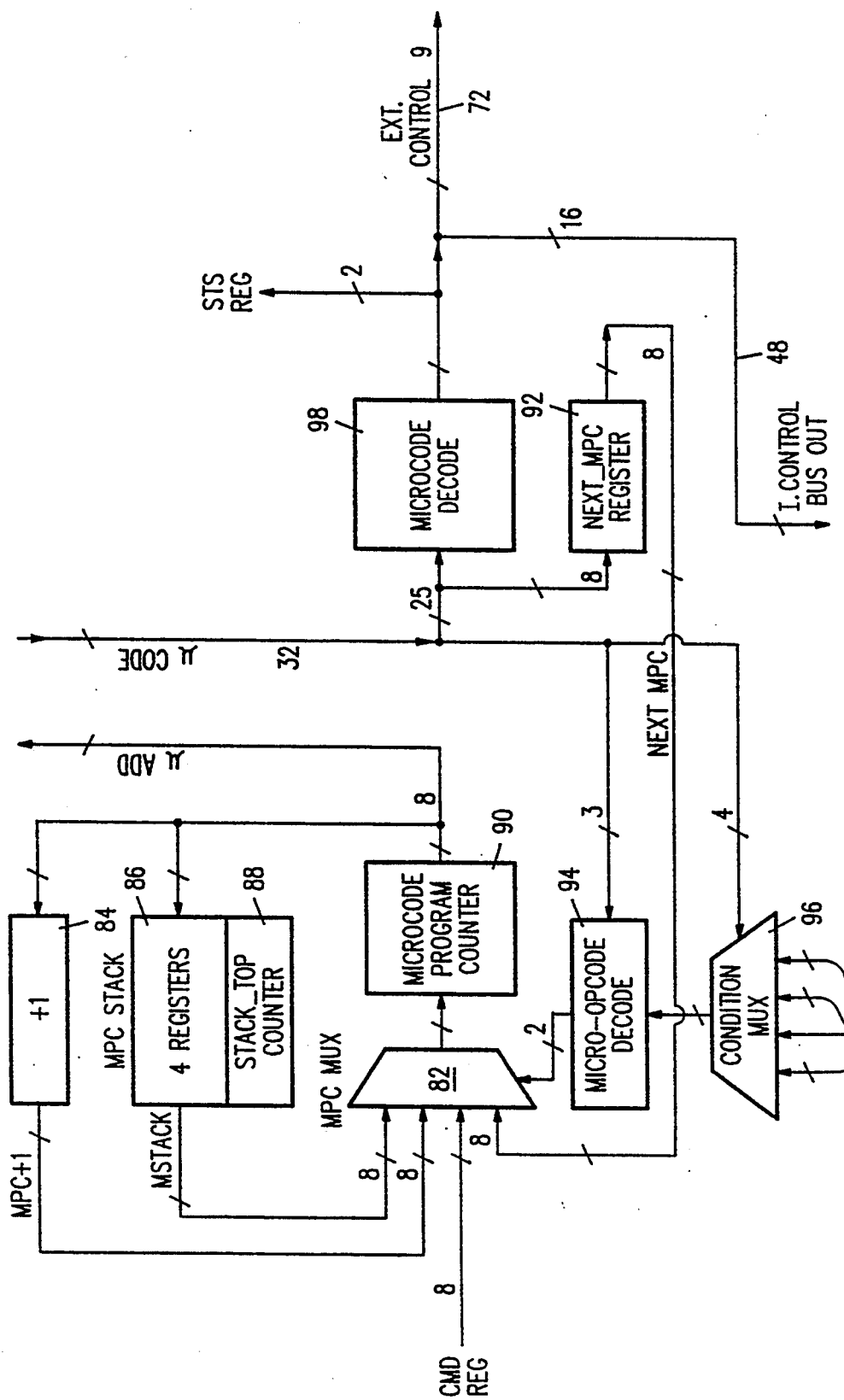
FIG. 3 is a detailed schematic block diagram of the microsequencer portion of the peripheral device shown in FIG. 1.

Referring to FIG. 3, there is shown a detailed block level circuit diagram of the microsequencer 50 of the device 10. The 8 bits from the CMD register 38 are supplied to a first multiplexer 82. The first multiplexer 82 also receives 8 bits from the output of a stack register 86 with its associated stack counter 88. The multiplexer 82 also receives 8 bits from an incrementer 84. Finally, the multiplexer 82 receives 8 bits from the next microcode program counter (NEXT$_{13}$ MPC) register 92. The multiplexer 82, therefore, receives four sets of 8 bit inputs and selects one of the eight bit inputs as the output thereof. The multiplexer 82 is switched based upon the output of the micro-opcode decode 94. Since there are four inputs to the multiplexer 82, 2 bits from the micro-opcode decode 94 are necessary to select the appropriate input as the output of the multiplexer 82.

The output of the multiplexer 82 is supplied to a microcode program counter 90. The counter 90 merely stores the input thereto. The output of the counter 90 is supplied to the incrementer 84 which increments the counter 90 by one. Thus, the output of the incrementer 84 is normal "sequential" flow, and as previously discussed, is supplied back as one of the inputs to the multiplexer 82. The output of the counter 90 is also supplied to the stack register 86 and is stored therein. Depending upon the address of the stack$_{13}$ top counter 88, one of the four registers 86 is selected as the output and is supplied as the input to the multiplexer 82. This is the conditional or unconditional branch flow. Finally, the output of the counter 90 is supplied as the microcode address for the microcode ROM 52.

For each address of the microcode ROM 52, the microcode data signal stored at the address 52 is supplied as a 32 bit microinstruction back into the microsequencer 50. The microcode comprise of 32 bits, has the following format:

xxxaaaabbbbbbbbccccccccccrrrrwwww

The opcode, comprised of the three left most significant bits (xxx), are supplied to the microopcode decode 94 for decoding. The next four contiguous bits (aaaa) are supplied to a condition multiplexer 96. The next eight bits (bbbbbbbb) are the address for the microcode. These eight bits (bbbbbbbb) are also supplied to the internal bus 48, to be supplied to the counters 60. The next nine bits (ccccccccc) are supplied along the external bus 72. The remaining eight bits comprised of four bits (rrrr) for read control and four bits (wwww) for write control are supplied also along the internal bus 48. The two status register bits are shared among these eight bits.

The eight bits (bbbbbbbb) for addressing the microcode are supplied to the NEXT$_{13}$ MPC register 92. The output of the NEXT$_{13}$ MPC register 92 is, as previously discussed, supplied back to the input of the multiplexer 82.

The test bus 70 from the counter 60, comparator 62, CRC unit 66 and ECC unit 68 comprises 16 bits and are supplied to the condition multiplexer 96. The four condition multiplexer bits from the microcode are used to switch the condition multiplexer 96 and to select the particular bit or bits out into the micro-opcode decode 94.

In the operation of the device 10 of the present invention, as previously discussed, in the preferred embodiment, the device 10 operates with a IBM PC compatible computer 12. As is well known for peripheral devices to be used with an IBM PC compatible system 12, the system 12 communicate with a peripheral device through address sectors. In the preferred embodiment, a sector is 512 bytes of consecutive data stream. The system 12 can communicate with the device 10 using Logical Sector Number (LSN) as the address to identify a particular sector location. The device 10 must then convert the LSN address into a Physical Sector Number (PSN) address to locate the address in the memory units 80 where the data is to be retrieved or where the data from the system 12 is to be written into.

Read Operation

In the operation of the device 10, if we assume that an application software desires to read data from the device 10, the application program would issue an interrupt to the DOS operating system. As is well known in the convention of DOS operating system, the DOS operating system would send a fixed, predetermined LSN data signal along the data bus 34. The address signal on the address bus 30 would be chosen to cause the data on the data bus 34 to be stored in the LSN register 36. This would be followed by a READ command which would be stored in the CMD register 38. The system 12 will then wait in a loop and then periodically poll the status of the STS register 40 until the READY status bit is set indicating that the device 10 has completed the operation.

The microsequencer 50 after detecting a READ command in the CMD register 38 would reset the READY status bit to "0" in the STS register 40. The data in the LSN register 36 would then be supplied onto the data address bus 46. The microsequencer 50 will then cause the external control bus 72 to activate the MAP ROM 74 to cause the data on the data/address bus 46 to be used as an address signal in the MAP ROM 74. From the address supply by the LSN register 36, the MAP ROM 74 would read out the content of the data at that address. This would correspond to the address of the PSN which is the address of the sector in the memory units 80 (a–n). The PSN data is then supplied along the data/address bus 46 and is stored in the scratchpad register 64.

The microsequencer 50 will then use the PSN data from the register 64 as the address for the memory units 80 (a–n). The location as specified by the address of the PSN data would correspond to the Directory of the root level. One sector full of Directory data from the memory unit 80 (a–n) is then read out along the data/address bus 46 and stored in the dual port SRAM 44. An error detection method (to be described hereinafter) is applied. If there is no error, the microsequencer 50 will then set the READY bit in the STS register 40 to "1" to signify to the system 12 that the READ operation has completed. The system 12 would periodically check the status of the READY bit If it is set to "1" then it indicates to the system 12, that the device 10 is ready for another command.

If there is an error, and it is not correctable, the ERROR bit in the STS Register 40 is set to "1". Finally, if the error is correctable, an error correction scheme is employed (to be discussed hereinafter). The system 12 will then retrieve the data from the dual port RAM 44, through the data register 35 and to its memory 16. DOS operating system would attempt to match the file name with the data from the Directory. If the file name is found in the Directory, the data associated with the file name is an LSN address with an offset in the File Allocation Table (FAT).

The FAT table is stored at another fixed LSN location. The FAT table is retrieved in a similar manner from the memory units 80 (a–n). Based upon the offset LSN address associated with the file name from the Directory, DOS will then calculate the sector number (which equals LSN for the start of the FAT table plus the offset LSN address) to obtain a resultant LSN number. The resultant LSN number is then transmitted to the device 10 and stored in the LSN register 36. Another READ operation would then commence all as previously described and the sector of data from that LSN address is retrieved.

From the FAT table the offset LSN address determined by the Directory is read to determine if it is the LSN address of the last sector or if it is the address to the next sector. If the content of the FAT table at the offset location is less than FFFF then the content at the offset is an address of the next sector. The next sector is calculated by adding the LSN of the starting location of the FAT table to the relative LSN value. Data from that sector is then retrieved all as previously discussed. If the content of the FAT table is equal to FFFF, then the sector is the last sector in the file.

The foregoing description of the Directory and FAT entry and their LSN address is well known from DOS convention.

Write Operation

In a write operation, the system 12 transfers an LSN address along the bus 34 to be stored in the LSN register 36. Thereafter, the system 12 transfers a sector of data from its memory 16 into the dual port SRAM 44, through the data register 35 of the device 10. The system 10 would then issue a WRITE command to the CMD register 38. The system will then stay in a waiting loop until the microsequencer 50 has changed the STS register 40 indicating that it has completed its operation.

The microsequencer 50 would then retrieve the command from the CMD register 38 and if it is a WRITE command it would reset the READY bit to "0" in the STS register 40. The microsequencer 50 would then address the MAP ROM 74 using the address from the LSN register 36. From the MAP ROM 74, the data which is the corresponding PSN would then be read out of the MAP ROM 74 and would be stored in the register 64.

Programming of the memory units 80 based upon the address from the PSN data stored in register 64 would then be performed. The PSN data from the register 64 would first be supplied along the data/address bus 46 as the address thereof to the memory unit 80. This would be followed by one sector full of data. Depending upon the design of the memory units 80, programming can be performed on a byte-by-byte basis or on a multiple byte basis. In the current preferred embodiment, programming is done on a byte-by-byte basis. After each byte is written into the memory unit 80, it is then read back for verification. This is accomplished by reading the data from the memory unit 80 and supplying it along the data/address bus 46 into the comparator 62. The comparator 62 would compare the data written into the memory unit 80 with the data read from the memory unit 80 from the same address location.

If the comparison shows the data was programmed correctly, the microsequencer 50 then moves onto the next byte. If the data was not stored correctly, then the microsequencer 50 writes the data back into the memory unit 80 applying more programming pulses. By applying more programming pulses, it is well known that in floating gate storage devices more charges would be attempted to be stored onto the floating gate. This then would be followed by another read verification step. Again, if the data was correctly written into the memory unit 80, the microsequencer 50 would then proceed onto the next byte. If no error were found, the microsequencer 50 would then set the READY bit in the STS register 40 to "1" signifying that it has completed its operation. If an error were found, the microsequencer 50 would then apply an error correction method (discussed hereinafter).

Error Correction

Because the storage cells of the memory unit 80 are of the floating gate type, errors in the storage cell can result from the charges on the floating gate decaying. This decay process can be divided into two stages. First, the charges stored on the floating gate can decay somewhat but still retain a charge, although it takes longer using the sense amplifier to determine whether it is a stored "1" or "0". In another stage of decay, the charges on the floating gate have decayed to a level where it has permanently changed the state of the storage cell from a "charged" to a "discharged" state. In this case, a permanent data error has occurred.

To correct errors of the first type, the device 10 offers two modes of read operation: a normal read and a slow mode read. In a normal mode read, if the data read from the memory unit 80 still results in data error, then the same address is read again in a slow mode. The slow mode read would cause the sense amplifiers to be turned on longer permitting the lower amount of charge stored on the floating gate to differentiate the charge level between a "1" or a "0".

As for the errors of the second type, each sector of data is written into the memory unit 80 with its associated error correction code (ECC). In one embodiment, the ECC is a Reed-Solomon code which applies 88 bits for each sector of data. In another embodiment, the ECC for a sector of data is encoded with CRC error detection. Finally, as will be shown, another embodiment of ECC is the use of redundant Hamming code.

Since each sector of data is written into the memory unit 80 with its associated ECC code, and since it is possible to detect under certain circumstances when the error has arisen, the device 10 can operate on the data to correct the error. The error correction can be one of three following methods.

1. In the first method, data from the memory unit 80 is read in the normal mode. If the error persists, the data from that sector is re-read in a slow mode.
2. In a second method, the sector data is first read in the normal mode. If error persists, this is followed by attempted correction on the sector of data using ECC correction scheme. Thereafter, if error persists, then the same sector of data is read in the slow mode with ECC applied thereto.
3. Finally, in yet another method of error correction, the data is first read in a normal mode. If error persists, this is followed by a re-read of the sector data in the slow mode. If error persists, the data in the just read slow mode is operated upon by the ECC unit 68 to correct the error therein.

Finally, if error still persists, then the data from the sector is read again in the normal mode with the ECC correction applied thereto.

Apart from error correction of the data, since the memory unit 80 has portions of it written more frequently than other portions, different error recovery schemes are used to protect different portions.

Since both the directory sector and the FAT sectors are retrieved frequently and are written into frequently (updated when a new file is written into the device 10), these sectors containing system information are stored in memory units 80 (a-n) redundantly. That is, 2×512 bytes are stored for each sector of system data. For system data, redundant Hamming code for error recovery is applied. In the redundant Hamming code, one byte of system data is stored as four bytes, in the following manner. 1 byte data+4 bits Hamming Code+4 bits inverted Hamming Code=2 bytes or 1 Unit A Redundant storage of Unit A, i.e. Unit A+Unit B, results in 4 bytes.

These four bytes of system data are stored in the memory unit 80 either sequentially, i.e. Unit A+Unit B, or in separate sectors. Since the Hamming code has the ability to detect and to correct a single bit error but only has the ability to detect two bit errors, each two byte unit (A or B) has the ability to determine whether its own data has one or two bits of error. Thus, when system data is read back from the memory unit 80, the following scheme is used to determine the best data:

|  | Unit A Correct | Unit A 1 bit error | Unit A 2 bit error |
| --- | --- | --- | --- |
| B Correct | Unit A | Unit B | Unit B |
| B 1 bit error | Unit A | corrected A | corrected B |
| B 2 bits error | Unit A | corrected A | un-usable | where each unit (A or B) is two bytes wide comprising of one byte of system data followed by the four bits of Hamming code and the four bits of inverted Hamming code.

During the read operation, after each sector of data is read out of the memory unit 80 and is stored in the dual port SRAM 44, the microsequencer 50 applies the foregoing error recovery schemes (whether it is ECC or CRC for data or redundant Hamming code for system data) to determine if error exists in the data just read. If the data cannot be recovered, the microsequencer 50 sets an ERROR bit in the STS register 40. However, if the data can be corrected, the microsequencer 50 looks in the MAP ROM 74 for a new unused PSN sector. The microsequencer 50 would then cause a new mapping of the LSN sector address stored in the LSN register 36 to the new, unused, fresh PSN data. This mapping would in essence be the storage of the new PSN number in the MAP ROM 74 in the address from the LSN register 36. Thereafter, the microsequencer 50 would automatically cause the data in the dual port SRAM 44 to be stored back into the memory unit 80 at the new PSN sector address.

Similarly, during a write operation, as each byte of data is written from the SRAM 44 into the memory unit 80 and is then read out and is compared to the data from the SRAM 44, if an error were found and the microsequencer 50 had already applied more programming pulses to attempt to store larger amount of charges onto the floating gate, then the microsequencer 50 would look up in the MAP ROM 74 to find a fresh unused PSN sector. The microsequencer 50 would then start all over again to write the same data into the new, unused PSN sector. When this is done, the microsequencer 50 would update the correspondence of the LSN from the LSN register 36 to the new PSN sector. Henceforth, access to the LSN would cause the microsequencer 50 to retrieve data from the new PSN address.

MAP ROM

A unique feature of the present invention is the use of the MAP ROM 74 to provide a mapping between each LSN address with the PSN address. The MAP ROM 74, as previously discussed in the preferred embodiment, can also be made of the same floating gate storage cell memory as the memory unit 80. The MAP ROM 74 contains one mapping entry between each LSN and PSN. Each mapping entry has the same size so finding a mapping entry for each LSN is simply multiplying LSN by the number of bytes per mapping entry. This provides the fastest mapping speed in identifying PSN when the number of initial manufacturing defect or the number of bad rows replacement after usage in the memory unit 80 is high.

With this MAP ROM 74, the microsequencer 50 can replace a defective sector in the memory unit 80 with an unused good sector whenever an error is detected. This replacement is accomplished by simply modifying the MAP ROM 74 translation table. Furthermore, as discussed heretofore, this translation under certain circumstances is done automatically without user intervention or knowledge. Thus, to the system 12, the storage in the memory unit 80 is always contiguous and is good, because every LSN mapping entry always points to a good PSN entry. However, if the device 10 runs out of "good" physical sectors to replace the defective physical sectors, then the device 10 will have discontiguous Logical sectors, similar to the conventional peripheral storage devices. In that event, however, the device 10 can be reformatted to again achieve contiguous logical sectors.

Furthermore, each of the memory units 80 can be partitioned into two areas during a high level DOS format operation. The two areas of the user accessible areas are "normal data area" where normal data sectors are used to store usage data and a "reserve area" where reserved sectors can be used to replace defective data sectors when found. Thus, to the user, virtually the same amount of user usable data sectors is always present.

Formatting

As is well known, prior to use, the device 10 must be formatted, similar to formatting a hard disk drive. This formatting can be accomplished at two levels: at a system level which is performed by a routine from the operating system. In addition, the device 10 can be formatted at a "low-level".

Initially, the device 10 is tested or formatted right after manufacturing. The device 10 is tested for retention failure reliability, among others. Each of the storage cells in the memory units 80 is stored with charges on its floating gate. Thereafter, the device 10 is subject to manufacturing screening tests, such as baking and voltage stress test on each of the storage cells in each of the sectors. If charges are not retained on the floating gate of the storage cell, or if the storage cells do not pass the other manufacturing screening tests, such as voltage stress, then the sector is deemed a "bad" sector. The "bad" sectors are marked with an indicia, such as by storing a data pattern of "00" in each byte of the sector. Thereafter, during the software format of the device 10, the software format program reads the bytes of all the sectors, and if a majority (or some other pre-set percentage) of the bytes are stored or marked with the data pattern of "00" then the sector is "bad" and the address of the "bad" sector is recorded in the MAP ROM 74. The address of the "bad" sectors are then no longer usable to map LSN to PSN.

In subsequent low-level format, after the device 10 has been in use, formatting test is performed on "non-bad" sectors. A "non-bad" sector is a sector whose address is not marked as being "bad" as stored in the MAP ROM 74. Because the data pattern of "00" or other indicia, may be actual data, the determination of whether a sector is "bad" or is "non-bad" cannot be made by looking at the data pattern or the indicia from the memory unit 80. The determination is made by looking at the addresses stored in the MAP ROM 74. Each of the floating gate storage cell of a "non-bad" sector is erased. Data is then written into the bytes of the "non-bad" sectors by the microsequencer 50 using the following parameters to carry out the write operation.

1. The microsequencer 50 causes a nominal erase time (ET) to be used. A longer erase time means that each of the storage cells can be erased into a "1" state more strongly and can be easier to be sensed as a "1". The erase time has the same effect on all cells.
2. A nominal write time is WT. A longer write time means that each of the storage cells in the memory unit 80 will be written to a "0" state more strongly and is easier sensed as a "0". However, it is also more likely that a "0" state can disturb other adjacent storage cells.
3. A nominal read sensitivity value is RN. Read sensitivity is set by the sensing circuit design. As previously discussed, in the device 10 of the present invention, the sensitivity can be increased by increasing the time period for the sense. Another possible value for read sensitivity is "RM" which requires that each of the storage cells be written with a "0" stronger than a normal "0" to be sensed as a "0".
4. Data pattern from the system 12 can be anything. However, when writing into the storage cells 80, some particular data patterns are easier to fail during a write operation than others, depending upon the circuit design of the particular memory unit 80. In particular, OF or FO are the most sensitive patters for the device 10. To boost the reliability of the device 10, the "good sector" selection process must guarantee that after the selection, the chance of the microsequencer 50 write failure using the nominal ET, WT and RN values should be minimized. The following is a selection criteria to achieve this goal:

| Testing Goal | Erase Time | Write Time | Data Pattern | Read Sensitivity |
| --- | --- | --- | --- | --- |
| Write w/maximum bit | $\frac{1}{2}$ * ET | $\frac{1}{2}$ * WT | 0 | RM |
| Write w/sensitive data pattern | $\frac{1}{2}$ * ET | $\frac{1}{2}$ * WT | OF and FO | RM |
| Write w/disturb data pattern | 2 * ET | 2 * WT | FF and 7F | RN |

Note:
The choice of data pattern and timing factor should be varied according to the characteristics of memory units 80.

Thus, in subsequent low level format after manufacturing, different data patterns are written repeatedly into each of the bytes of the "non-bad" sectors. The data pattern from each of the bytes of the "non-bad" sectors is read and is compared to the data pattern written into those bytes. If the comparison results in an incorrect match between the data pattern read and the data pattern written into the "non-bad" sectors, then those sectors are also deemed "bad" and the address of those sectors is written into the MAP ROM 74 as additional "bad" sectors.

Alternatively, if the comparison between the data pattern read from each of the bytes of the "non-bad" sector correctly matches the data pattern written into each of those bytes, then that physical sector address is stored in the MAP ROM 74 as a usable sector to which a logical sector address is mapped.

Self-Booting Storage Device

Figure 2:
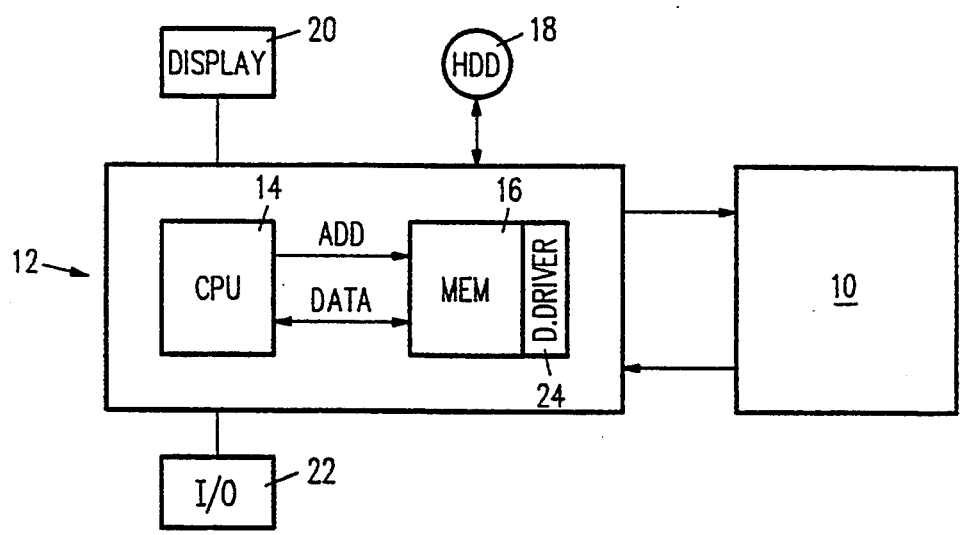
FIG. 2 is a block level system diagram of a system comprising a computer, memory and other units for connecting and interfacing with the solid state memory device of FIG. 1.
Figure 4:
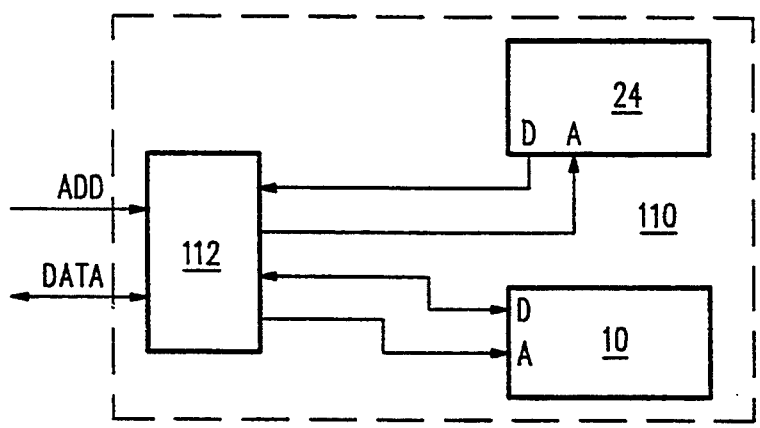
FIG. 4 is a block level diagram of a self bootable solid state memory storage device of the present invention.

As previously discussed, in the device 10 of the present invention, it is used for the system 12 operating with a device driver 24 in its memory 16, as shown in FIG. 2. The device driver 24 is typically loaded from a hard disk drive 18 or some other type of peripheral device. Referring to FIG. 4 there is shown another embodiment of the device 110 of the present invention, called an EECARD with a self-contained device driver 24. The device comprises the device 10 with its data and address ports all as previously described and shown in FIGS. 1 and 2. In addition, the device 110 comprises a ROM 24, PROM or floating gate memory storage. The memory 24 would contain the device drivers 24. Finally, the EECARD 110 would also contain a controller 112. The EECARD 110 is a self "booting" type in that upon start-up, the device driver from the ROM 24 is loaded through the controller 112 into the memory 16 of the system 12. Thereafter, the controller 112 is switched such that the data and address buses from the system 112 are then directed towards the device 10. The EECARD 110 can be of the type satisfying the specifications for the PCMCIA standard.

Figure 5A:
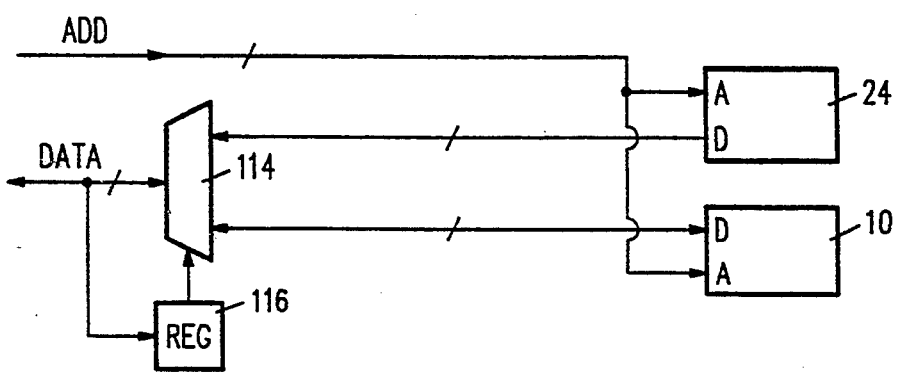
FIGS. 5a and 5b are different embodiments of the controller portion of the solid state memory storage device of FIG. 4.

Referring to FIG. 5a, there is shown one embodiment for the controller 112. In the embodiment shown in FIG. 5a, data from the system 12 is supplied to a multiplexer 114 which is controlled by the contents of a register 116. The data in the register 116 controls the operation of the multiplexer 114. Once the device driver from the memory 24 has been loaded into the memory 16, the multiplexer 114 is switched so that the data bus is then connected directly to the device 10.

Figure 5B:
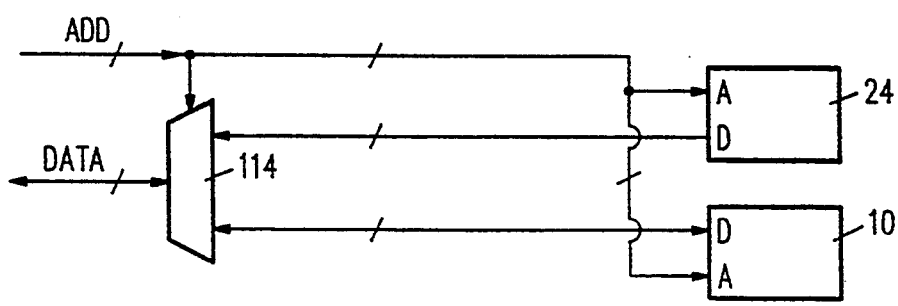

Referring to FIG. 5b, there is shown another embodiment of the controller 112, which is the preferred embodiment. Data to and from the system again, is supplied to a multiplexer 114. The multiplexer 114 is connected to the memory 24 and to the device 10. A particular address line from the system 12 is supplied to the multiplexer 114 and is used to set the multiplexer 114. In the preferred embodiment, address A17 is used to select a multiplexer 114. Lower order address signals, i.e. address signals from A0–A16 are supplied directly to the memory 24 and data therefrom is read out onto the system 12 into its memory. Thereafter, higher order addresses with A17 set to 1 is then used to address the device 10.

There are many advantages to the device 10 or 110 of the present invention and the method of their operation. As can be seen, because of the unique nature of the MAP ROM 74, the memory units 80 do not have to be 100% defective-free from manufacturing defects. Through the use of the MAP ROM 74 mapping LSN to PSN, defective sectors can be mapped out of the memory unit 80 without any loss or penalty. Furthermore, as the storage cells are used and as they degrade in performance, various recovery schemes are provided automatically so that to the user, the device 10 remains as defective-free as when originally first used.

Finally, through the use of redundant storage in the memory units 80, more sensitive system data can virtually be guaranteed their readability and reliability for storage.

What is claimed is:

1. A solid state peripheral storage device for interfacing with a computer providing a logical sector signal, said device comprising:
   means for translating said logical sector signal into a physical sector signal;
   memory means for storing data signals, said memory means comprising a plurality of floating gate storage cells, and
   means for addressing said memory means with said physical sector signal for reading the data signals therefrom in two modes: wherein in a first mode each of said addressed floating gate storage cells is sensed longer than in the second mode.

2. The device of claim 1 further wherein said means for translating translates said logical sector signal into a new physical sector signal in the event said floating gate storage cells in said memory means at an address defined by said physical sector signal are defective, and wherein said addressing means addresses said memory means with said new physical sector signal.

3. The apparatus of claim 1 further comprising:
   means for correcting error in said data signals written into or read from said memory means.

4. The apparatus of claim 3 wherein said correcting means comprises means for applying a Reed-Solomon code to said data signals.

5. The apparatus of claim 3 wherein said correcting means comprises means for applying a CRC code to said data signals.

6. The apparatus of claim 3 wherein said correcting means comprises means for applying a redundant Hamming code to said data signals.

7. The apparatus of claim 1, wherein said translating means comprises a random access memory means for random access translating said logical sector signal into a physical sector signal.

8. The apparatus of claim 7 wherein said random access memory means further comprises a plurality of floating gate storage cells.

9. The apparatus of claim 1 wherein said translating means contains one mapping entry between each logical sector signal and physical sector signal, wherein each mapping entry has the same size.

10. The apparatus of claim 9, wherein said translating means translates said logical sector signal into said physical sector signal by multiplying said logical sector signal by the number of bytes per mapping entry.

* * * * *